United States Patent
Kasuga

(10) Patent No.: US 8,385,116 B2
(45) Date of Patent: Feb. 26, 2013

(54) NONVOLATILE SEMICONDUCTOR STORAGE DEVICE, CONTROLLER AND THRESHOLD ADJUSTMENT METHOD

(75) Inventor: Kazunori Kasuga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 12/603,103

(22) Filed: Oct. 21, 2009

(65) Prior Publication Data

US 2010/0124112 A1 May 20, 2010

(30) Foreign Application Priority Data

Nov. 19, 2008 (JP) .................................. 2008-296129

(51) Int. Cl.
*G11C 16/04* (2006.01)
(52) U.S. Cl. ......... 365/185.03; 365/185.21; 365/185.24; 365/189.07; 365/189.15
(58) Field of Classification Search ............. 365/185.03, 365/185.09, 185.21, 185.24, 189.15, 189.07
See application file for complete search history.

(56) References Cited

U.S. PATENT DOCUMENTS

| | | | |
|---|---|---|---|
| 4,901,320 A | 2/1990 | Sawada et al. | |
| 6,819,590 B2 | 11/2004 | Goda et al. | |
| 7,075,825 B2 * | 7/2006 | Banks ...................... | 365/185.19 |
| 7,613,043 B2 * | 11/2009 | Cornwell et al. ......... | 365/185.18 |
| 7,639,531 B2 * | 12/2009 | Cornwell et al. ......... | 365/185.03 |
| 7,639,542 B2 * | 12/2009 | Cornwell et al. .......... | 365/185.2 |
| 7,852,690 B2 * | 12/2010 | Cornwell et al. .......... | 365/189.2 |
| 7,911,834 B2 * | 3/2011 | Cornwell et al. ........ | 365/185.03 |
| 2003/0227811 A1 | 12/2003 | Sugiura et al. | |
| 2005/0047207 A1 | 3/2005 | Sugiura et al. | |
| 2005/0213390 A1 | 9/2005 | Sugiura et al. | |
| 2006/0028875 A1 | 2/2006 | Avraham et al. | |
| 2008/0052565 A1 | 2/2008 | Oku | |
| 2008/0175055 A1 | 7/2008 | Kim | |
| 2008/0175057 A1 | 7/2008 | Sugiura et al. | |

FOREIGN PATENT DOCUMENTS

| | | |
|---|---|---|
| CN | 101211659 A | 7/2008 |
| JP | 2509297 B2 | 6/1996 |
| JP | 2004-14043 A | 1/2004 |
| JP | 2005-327359 A | 11/2005 |
| JP | 2006-004534 A | 1/2006 |
| JP | 2008-52798 A | 3/2008 |
| KR | 10-2005-0108325 A | 11/2005 |

OTHER PUBLICATIONS

Korean Office Action dated Jun. 29, 2011, issued in corresponding Korean Patent Application No. 10-2009-0109701.
German Office Action issued Nov. 30, 2011, received Dec. 2, 2011, in corresponding German Patent Application No. 102009051109.1.

(Continued)

*Primary Examiner* — VanThu Nguyen
(74) *Attorney, Agent, or Firm* — Westerman, Hattori, Daniels & Adrian, LLP

(57) ABSTRACT

A nonvolatile semiconductor storage device includes a plurality of cells for storing data on a basis of charges stored nonvolatilly, a write unit for writing and erasing data on the cell by injecting or extracting charges into or from the cell, a comparator for comparing the voltage produced by a selected cell to be read out with a threshold, a read unit for outputting read data on the basis of the comparison result by the comparator, and a threshold update unit for updating the threshold of the comparator according to the voltage produced by the selected cell.

12 Claims, 17 Drawing Sheets

OTHER PUBLICATIONS

Chinese Office Action dated Jul. 24, 2012, issued in corresponding Chinese Patent Application No. 200910222847.3, w/ English translation.

Japanese Office Action dated Dec. 4, 2012, issued in corresponding application No. 2008-296129, with English Translation.

* cited by examiner

FIG. 11

|     | SE-2 | SE-1 | SE-0 |
|-----|------|------|------|
| SA0 | 0    | 0    | 0    |
| SA1 | 0    | 0    | 1    |
| SA2 | 0    | 1    | 0    |
| SA3 | 0    | 1    | 1    |
| SA4 | 1    | 0    | 0    |
| SA5 | 1    | 0    | 1    |
| SA6 | 1    | 1    | 0    |
| SA7 | 1    | 1    | 1    |

FIG. 17

|  | SE – 5 | SE – 4 | SE – 3 | SE – 2 | SE – 1 | SE – 0 |
|---|---|---|---|---|---|---|
| SA0 | 0 | 0 |  |  |  |  |
| SA1 | 0 | 1 |  |  |  |  |
| SA2 | 1 | 0 | 0 | 0 |  |  |
| SA3 |  |  | 0 | 1 |  |  |
| SA4 |  |  | 1 | 0 |  |  |
| SA5 |  |  |  |  | 0 | 0 |
| SA6 |  |  |  |  | 0 | 1 |
| SA7 |  |  |  |  | 1 | 0 |

NONVOLATILE SEMICONDUCTOR STORAGE DEVICE, CONTROLLER AND THRESHOLD ADJUSTMENT METHOD

CROSS-REFERENCE TO RELATED APPLICATION

This application is based upon and claims the benefit of priority of the prior Japanese Patent Application No. 2008-296129 filed on Nov. 19, 2008, the entire contents of which are incorporated herein by reference.

FIELD

An aspect of the embodiments discussed herein is directed to a nonvolatile semiconductor storage device.

BACKGROUND

Memory devices using non-volatile memories such as USB memories, memory cards and solid state drives are widely used. Since these memory devices store user data, there has been a demand for the memory devices to provide reliability for storing data for a long time.

There is a tendency that user data, such as images, music and video, which is to be stored in memory devices, increases. Thus, it has been requested that memory devices have large capacities. Processes for manufacturing non-volatile memories have been aggressively shortened.

As conventional techniques related to the present invention, there are techniques that are disclosed in the following patent documents, for example. Accordingly, Japanese Laid-open Patent Publication No. 2004-014043 discusses a technique that a nonvolatile semiconductor executes write of data to the cell transistors at a voltage lower than an ordinary write voltage so as to change a threshold value of the cell transistors in analog fashion. Japanese Patent No. 2509297 discusses a technique that a nonvolatile memory device detects data errors arising from loss of charge in the floating gates of memory cells and corrects by applying two different sense voltages to the memory cells and comparing the outputs. Japanese Patent Laid-open Publication No. 2006-004534 discusses a technique that the ferroelectric storage device generates the reference potential by using a dummy cell.

SUMMARY

A nonvolatile semiconductor storage device includes a plurality of cells for storing data on a basis of charges stored nonvolatilly, a write unit for writing and erasing data on the cell by injecting or extracting charges into or from the cell, a comparator for comparing the voltage produced by a selected cell to be read out with a threshold, a read unit for outputting read data on the basis of the comparison result by the comparator, and a threshold update unit for updating the threshold of the comparator according to the voltage produced by the selected cell.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 11 is an explanatory diagram of values indicating sense amplifiers;
FIG. 17 is an explanatory diagram of values indicating sense amplifiers.

DESCRIPTION OF EMBODIMENTS

As described previously, voltage levels of a written state and erased state of a memory cell of a non-volatile memory vary in proportion to the number of rewriting operations. The non-volatile memory has a characteristic in which a difference between the voltage level of the written state and the voltage level of the erased state becomes small. This characteristic becomes more noticeable when a process for manufacturing the non-volatile memory is shortened.

However, a threshold that distinguishes between the written state and erased state of the memory cell is a fixed value that is specified on the basis of a standard cell.

Thus, when the variation with the increase in the number of the rewriting operations increases, the written state and erased state may not be accurately distinguished. This causes the end of the lifetime of the non-volatile memory.

Advancement of manufacturing processes in the future will cause a reduction in margins of the voltage levels of the written state and erased state for the threshold that distinguishes the written state and the erased state. This results in a problem of reductions in the lifetime and reliability of the non-volatile memory.

Embodiments of the present invention are described below with reference to the accompanying drawings.

Figure 1:
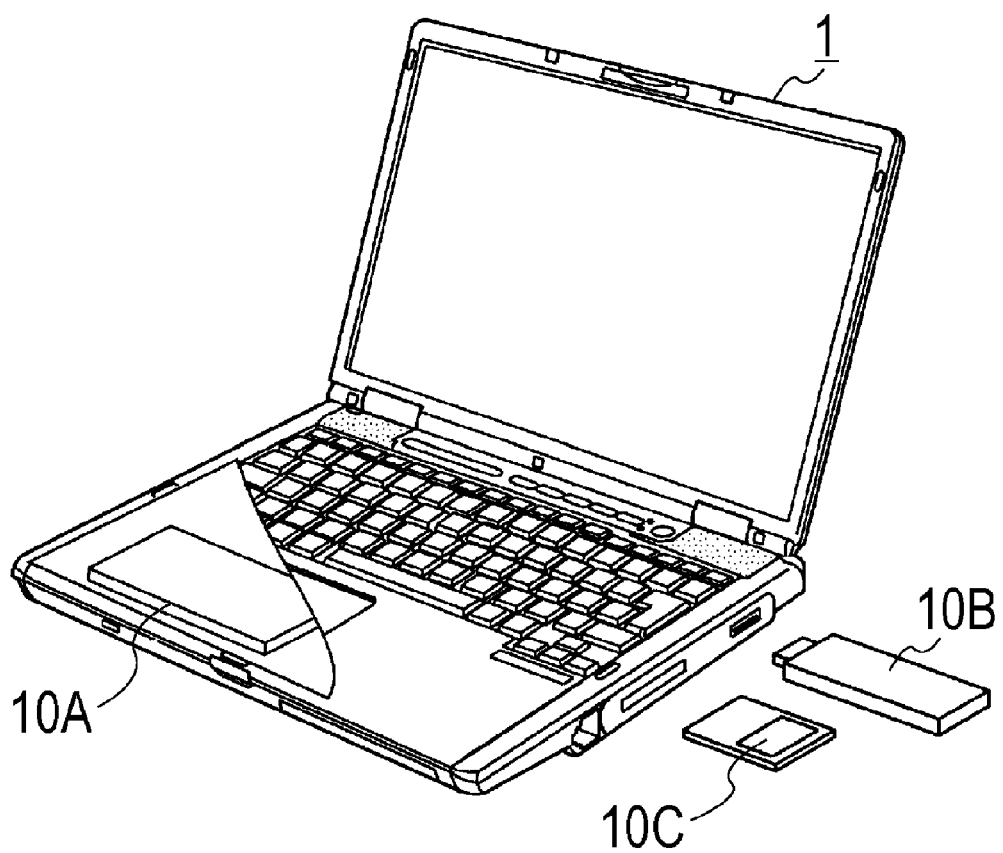
FIG. 1 is a diagram of a semiconductor storage device.
Figure 2:
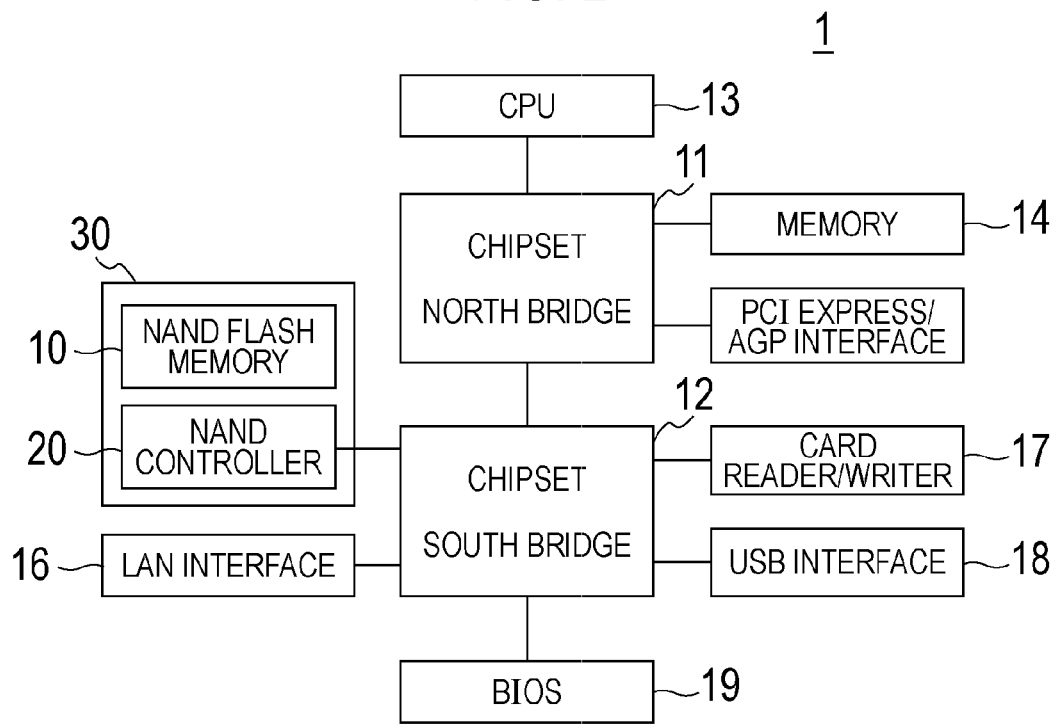
FIG. 2 is a diagram illustrating a hardware configuration of an information processing device using the semiconductor storage device.

FIG. 1 is a diagram illustrating a semiconductor storage device according to the present embodiment. FIG. 2 is a diagram illustrating a hardware configuration of an information processing device using the semiconductor storage device.

As illustrated in FIG. 1, a semiconductor storage device 10A according to the first embodiment is a so-called solid state drive (SSD) that is mounted in the information processing device 1 as an auxiliary storage device. A semiconductor storage device 10B is an USB memory that is connected with a USB interface of the information processing device 1. A semiconductor storage device 10C is a memory card that is inserted in a card reader/writer of the information processing device 1 to be read from and written to.

The semiconductor storage device according to the present embodiment is a non-volatile memory such as a NAND flash memory or a NOR flash memory. The semiconductor storage device according to the present embodiment, however, is not limited to this. The semiconductor storage device according to the present embodiment may be a memory from which data is read by comparing a cell current with a threshold. In the following description, the semiconductor storage device according to the present embodiment is referred to a flash memory module 10 for convenience.

The information processing device 1 illustrated in FIG. 2 includes a memory 14 and a CPU 13. The memory 14 is a main storage device, and the CPU 13 is a central processing unit. In addition, the information processing device 1 includes a chipset (North Bridge) 11 and a BIOS 19. The chipset 11 performs communication of information with the CPU 13, the memory 14 and the like at high speed and controls the CPU 13, the memory 14 and the like. The BIOS 19 stores a group of programs that control basic input and output related to peripheral devices.

Furthermore, the information processing device 1 includes a chipset (South Bridge) 12, a card reader/writer 17, an USB/PCI interface 18, a LAN interface 16 and the flash memory module 10. The chipset 12 performs communication of information with peripheral devices at relatively lower speeds than the CPU 13 and memory 14, and controls the peripheral devices. The card reader/writer 17 performs reading from and writing into a memory card. The USB/PCI interface 18 provides a connection with an USB-compatible device or a PCI bus-compatible device. The LAN interface 16 provides a connection with a network board to allow for communications with the external. The flash memory module 10 includes a NAND flash memory 30 that is a non-volatile memory and a NAND controller 20 that controls the flash memory. The information processing device 1 is not limited to a personal computer. The information processing device 1 may be any device requiring a storage device, such as a mobile phone or a PDA.

Figure 3:
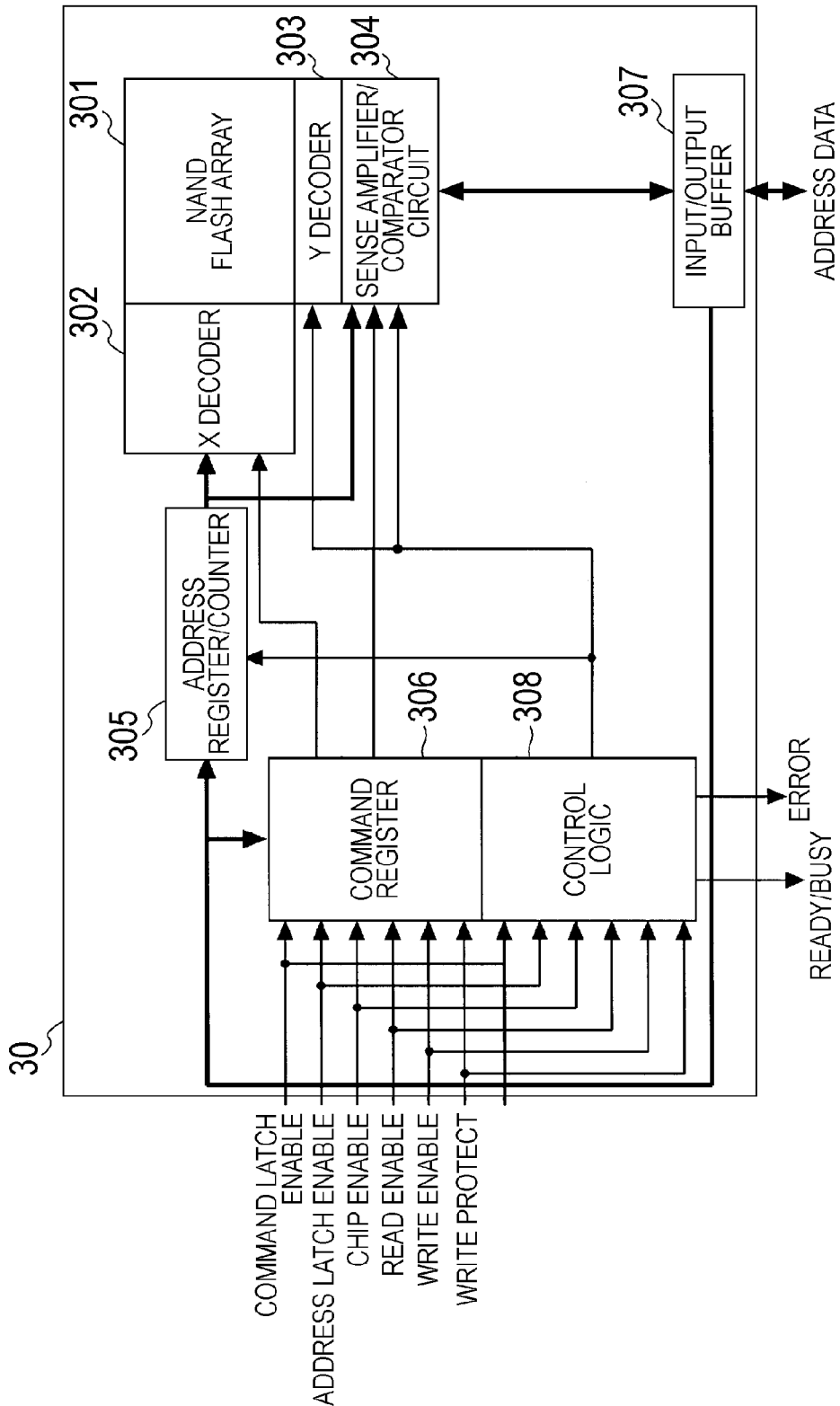
FIG. 3 is a block diagram illustrating the configuration of a flash memory.

Next, the flash memory according to the present embodiment is described below. FIG. 3 is a block diagram illustrating the configuration of the flash memory according to the present embodiment.

The flash memory 30 includes a NAND flash array 301, an X decoder 302, a Y decoder 303, a sense amplifier/comparator circuit 304, an address register/counter 305, a command register 306, an input/output buffer 307 and a control logic 308.

The NAND flash array 301 includes a plurality of cells that are two-dimensionally arranged. Gates of the cells are connected via a word line WL for each row. Sources and drains of the cells are connected via a bit line BL for each column.

The X decoder 302 selects a row direction of cells that are two-dimensionally arranged and form the NAND flash array 301. The Y decoder 303 selects a column direction of cells that are two-dimensionally arranged and form the NAND flash array 301.

The sense amplifier/comparator circuit 304 compares a voltage held by each of the cells of the NAND flash array 301 with a threshold and outputs the comparison results as digital information.

The address register/counter 305 specifies an address to access the NAND flash array 301. The command register 306 maintains a received command. The input/output buffer 307 is a storage region to temporarily store data of the information processing device 1 used as a host and data for input and output at an address. The control logic 308 is a controller that controls the flash memory 30.

The command register 306 and the control logic 308 receive, from the host, a command latch enable signal, an address latch enable signal, a chip enable signal, a read enable signal, a write enable signal and a write protect signal, as control signals for input and output. Combinations of these signals are treated as commands. The control logic 308 outputs a ready/busy signal and an error signal.

Figure 4:
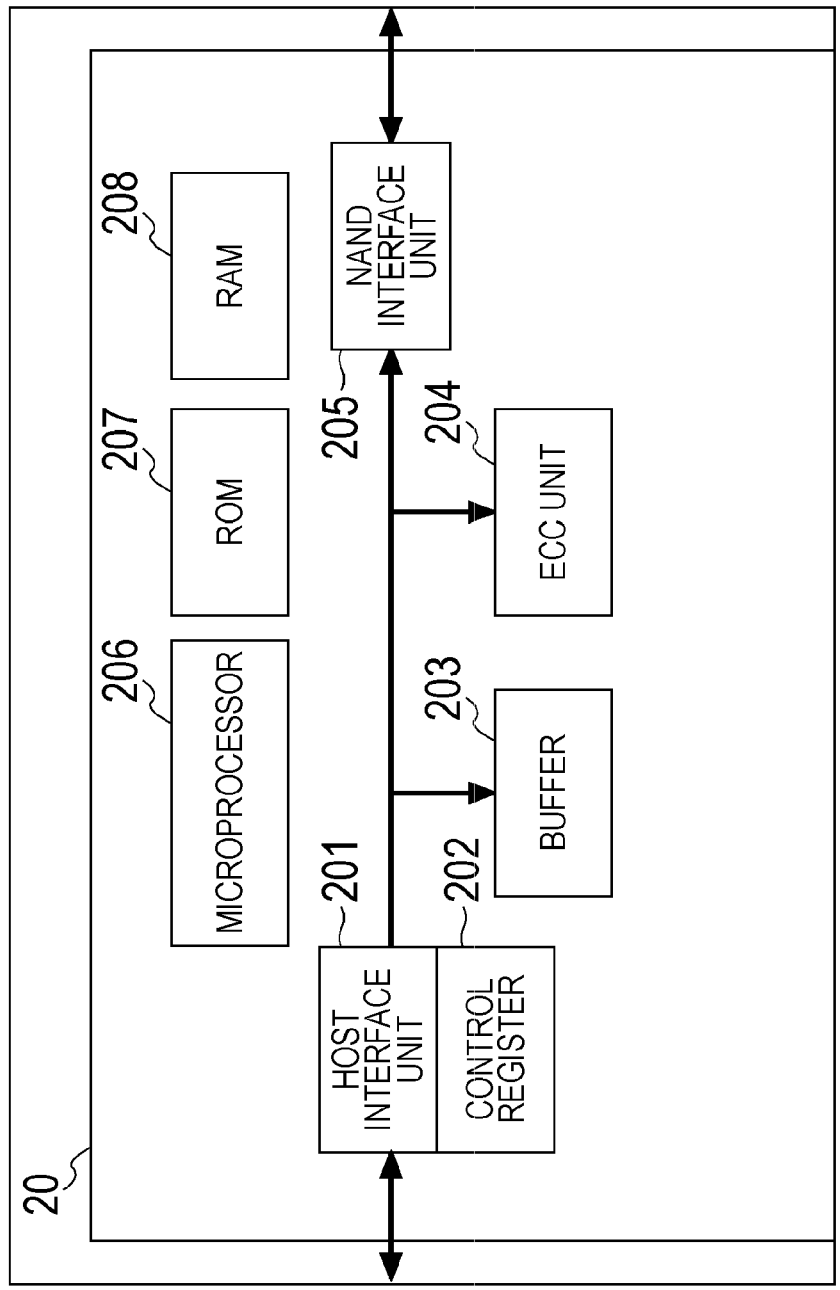
FIG. 4 is a block diagram illustrating the configuration of a NAND controller.

Next, the NAND controller is described. FIG. 4 is a block diagram illustrating the configuration of the NAND controller.

The NAND controller 20 includes a host interface unit 201, a control register 202, a buffer 203, an ECC unit 204, a NAND interface unit 205, a microprocessor 206, a ROM 207 and a RAM 208.

The host interface unit 201 transmits and receives a command to and from the host. The control register 202 is a region for holding various parameters.

The NAND interface unit 205 transmits and receives a command to and from the NAND flash memory 30. The buffer 203 is a region for temporarily holding the command read from the NAND flash memory by the NAND interface unit 205 and the command received from the host by the host interface unit.

The ECC unit 204 generates an ECC when data is written. The ECC unit 204 detects a data error on the basis of the ECC and corrects the data when the data is read.

The microprocessor 206 controls the entire NAND controller 20. The ROM 207 stores firmware used for processing performed by the microprocessor 206. The RAM 208 is a memory used by the microprocessor 206.

The microprocessor 206 operates in accordance with the firmware read from the ROM 207 to process a command received via the command register 306. The microprocessor 206 functions as a write unit, an erasure unit, a read unit and a threshold update unit by processing the command.

The microprocessor 206 functioning as the write unit transmits the address of the NAND flash memory 30 that accesses the address register/counter 305 on the basis of the received command.

In the same way, the microprocessor 206 functioning as the erasure unit transmits the address of the NAND flash memory 30 that accesses the address register/counter 305 on the basis of the received command.

The microprocessor 206 functioning as the read unit transmits the address of the NAND flash memory 30 that accesses the address register/counter 305 on the basis of the received command.

The microprocessor 206 functioning as the threshold update unit changes a threshold of the sense amplifier/comparator circuit 304 of the NAND flash memory 30 and reads data from the cell. The microprocessor 206 functioning as the threshold update unit then calculates upper and lower limits of the threshold that are capable of being read without a read error and determines a new threshold that lies between the upper and lower limits. The threshold update unit writes, in the NAND flash memory 30, an identification code of a sense amplifier that uses the determined threshold.

Accordingly, the microprocessor 206 functioning as the read unit references the identification code determined by the threshold update unit and uses corresponding information SE-0 to SE-2 for selection as enable to selectively operate the sense amplifier when data is read from the NAND flash memory 30.

Figure 5:
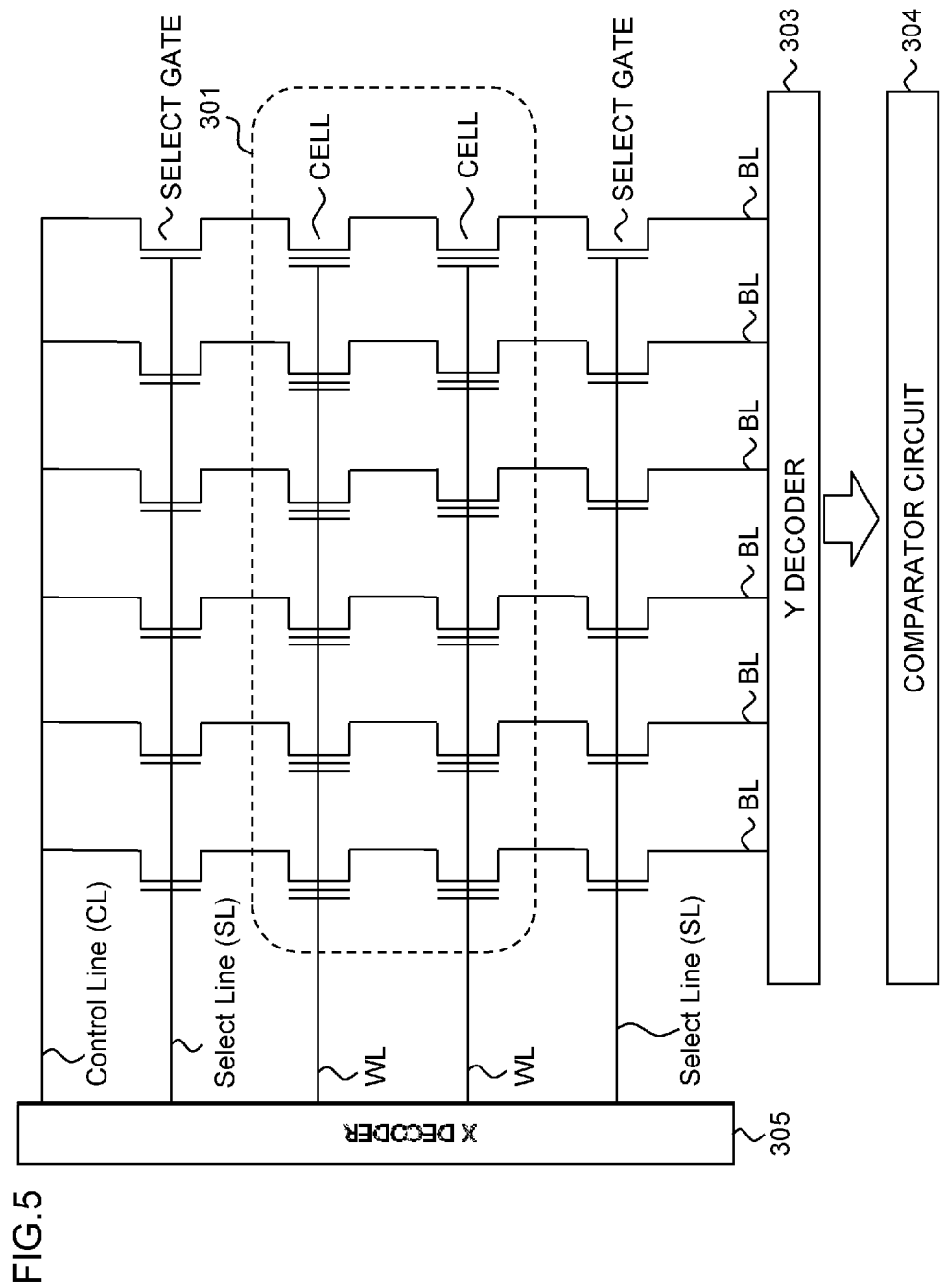
FIG. 5 is a circuit diagram illustrating a plurality of cells that form a NAND flash array.
Figure 6:
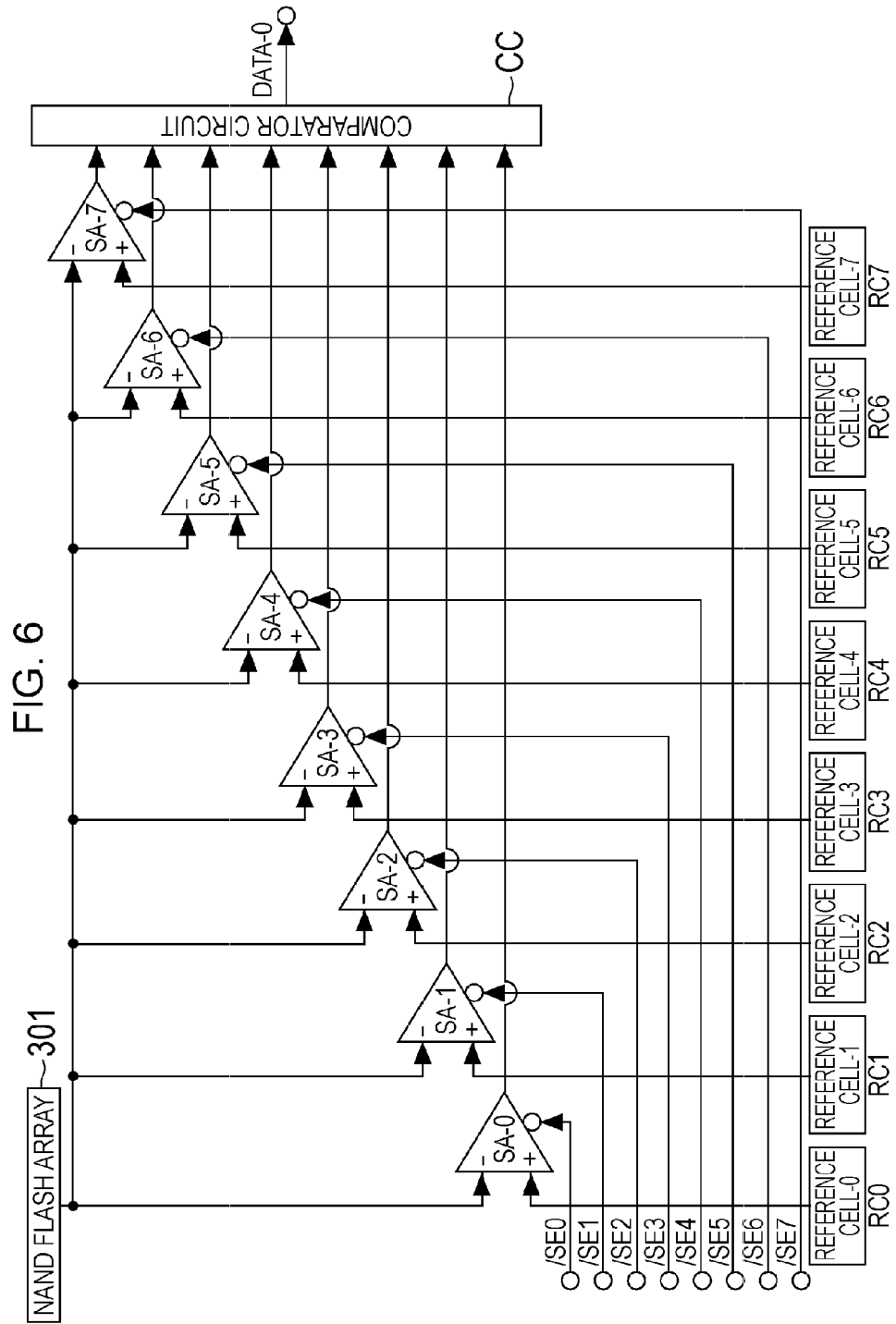
FIG. 6 is a circuit diagram illustrating a sense amplifier/comparator circuit.

Next, the plurality of cells forming the NAND flash array, and the sense amplifier/comparator circuit 304, are described. FIG. 5 is a circuit diagram illustrating the plurality of cells forming the NAND flash array. FIG. 6 is a circuit diagram illustrating the sense amplifier/comparator circuit.

As illustrated in FIG. 5, a voltage is applied between the gate and source of the cell via a bit line BL selected by the Y decoder 303 and a word line WL selected by the X decoder 302 in the NAND flash array 301. Electrons are stored in a floating gate of the cell to which the voltage is applied. By doing this, writing of data is performed.

When a voltage is applied between the gate and drain of the cell via a bit line BL selected by the Y decoder 303 and a word line WL selected by the X decoder 302 in the NAND flash array 301, the electrons are removed from the floating gate. By doing this, erasure of data is performed.

In addition, a current (cell current) flows between the source and drain of the cell via a bit line BL selected by the Y decoder 303 and a word line WL selected by the X decoder 302 in the NAND flash array 301. When the electrons are stored in the floating gate, the resistance of the bit line BL increases. Therefore, the cell current does not flow and the cell is in a "0" state. When the voltage is not stored in the floating gate, the resistance of the bit line BL does not change. Therefore, the cell current flows and the cell is in a "1" state. By doing this, reading of data is performed.

Since bit lines and word lines are connected in units of a plurality of cells, the NAND flash array 301 writes, reads and erases data in units of cell groups. Each cell group consists of cells that share a line.

The sense amplifier/comparator circuit 304 that is connected with the NAND flash array 301 includes a plurality of sense amplifiers SA0 to SA7, reference cells RC0 to RC7 and a comparator CC, as illustrated in FIG. 6. Each of the sense amplifiers SA0 to SA7 compares the voltage held by the cell with the threshold.

The voltage held in the floating gate by the cell is proportional to the cell current flowing between the source and the drain. In the present embodiment, predetermined reference currents flow in the reference cells RC0 to RC7 connected with the respective sense amplifiers SA0 to SA7. When a cell current that is the same as the reference current flows, the voltage held by the cell is regarded as a threshold.

The sense amplifiers SA0 to SA7 compare the cell currents flowing in the cells with the reference currents and output the results of the comparisons of the voltages which are produced on the bit line BL by injecting or extracting charges into or from the cell with the thresholds. The reference currents, or thresholds, which are used for the comparisons by the sense amplifiers SA0 to SA7, are different. The control logic (threshold update unit) selectively operates any of the sense amplifiers SA0 to SA7 to adjust the threshold, as described later.

The comparator circuit CC converts outputs (comparison results) from the sense amplifiers SA0 to SA7 into digital data. When the voltage which is produced on the bit line BL by injecting or extracting charges into or from the cell is higher than the threshold, the comparator circuit CC outputs "0". When the voltage which is produced on the bit line BL by injecting or extracting charges into or from the cell is lower than the threshold, the comparator circuit CC outputs "1".

Figure 7:
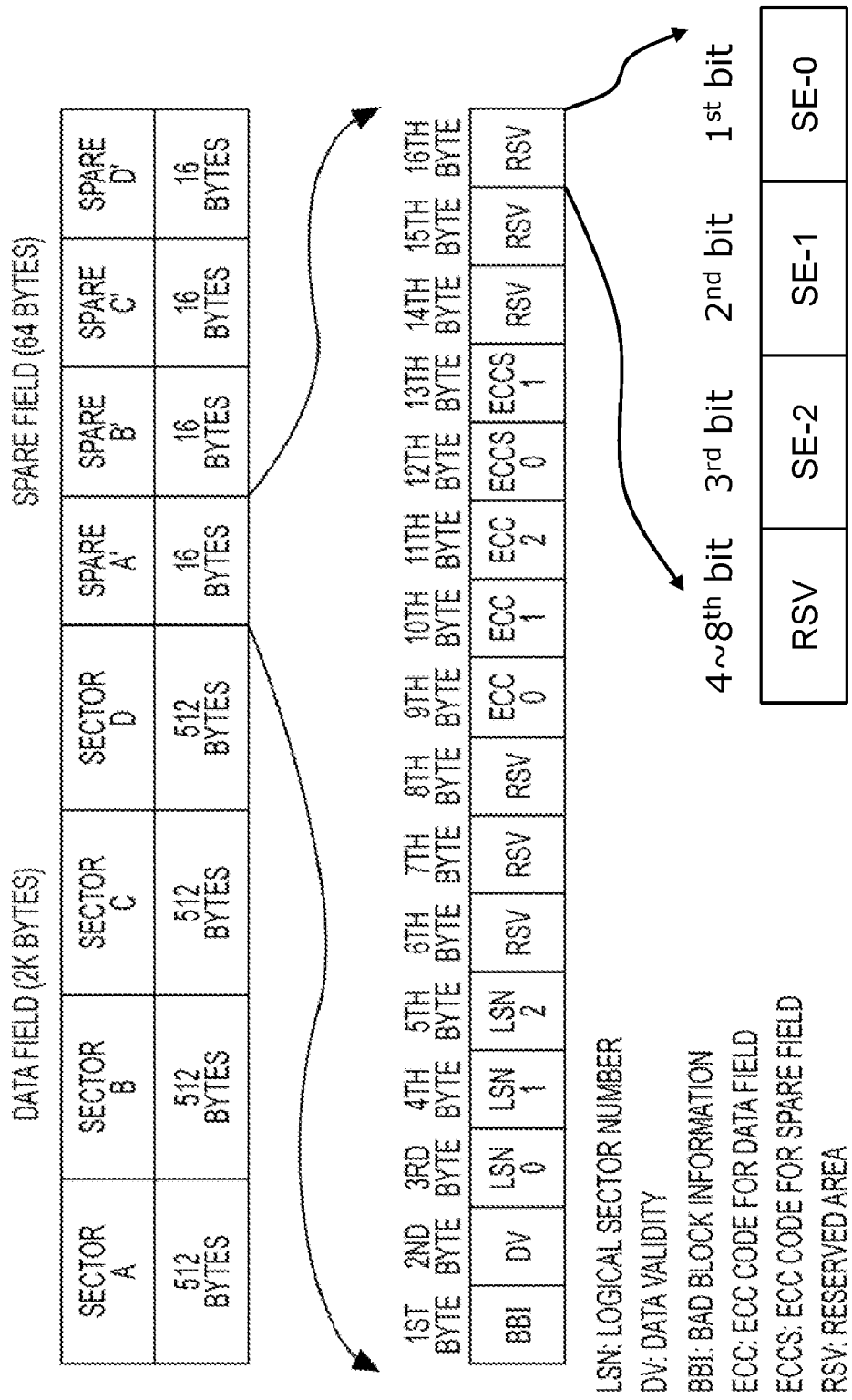
FIG. 7 is a diagram illustrating the configuration of data stored in the NAND flash array.

Next, the configuration of data stored in the NAND flash array is described. FIG. 7 is a diagram illustrating the configuration of the data stored in the NAND flash array.

The data that is read and written from and into the NAND flash memory 30 is stored in data fields in units of sectors, as illustrated in FIG. 7. Spares, which are attribute information corresponding to respective sectors, are stored in spare fields. The sectors A to D, and the spares A' to D' corresponding to the sectors A to D, constitute blocks. The data is erased in units of blocks. In each of the spares corresponding to the respective sectors, LSNs (logic sector numbers), DV (data validity), BBI (bad block information), ECCs (error correction codes for data field), ECCSs (error correction codes for spare field), and identification codes SE-0 to SE-2 are written. The LSNs are data indicating numbers of the corresponding sectors. The DV is data used for validity check. The BBI indicates a defective block in which data may not be written due to degradation of the cell. The ECCs are error correction codes for the sectors. The ECCSs are error correction codes for the spares. The identification codes SE-0 to SE-2 indicate a sense amplifier selected by the threshold update unit.

Next, a method for adjusting a threshold by means of the threshold update unit is described with reference to FIGS. 8 to 13.

Figure 8:
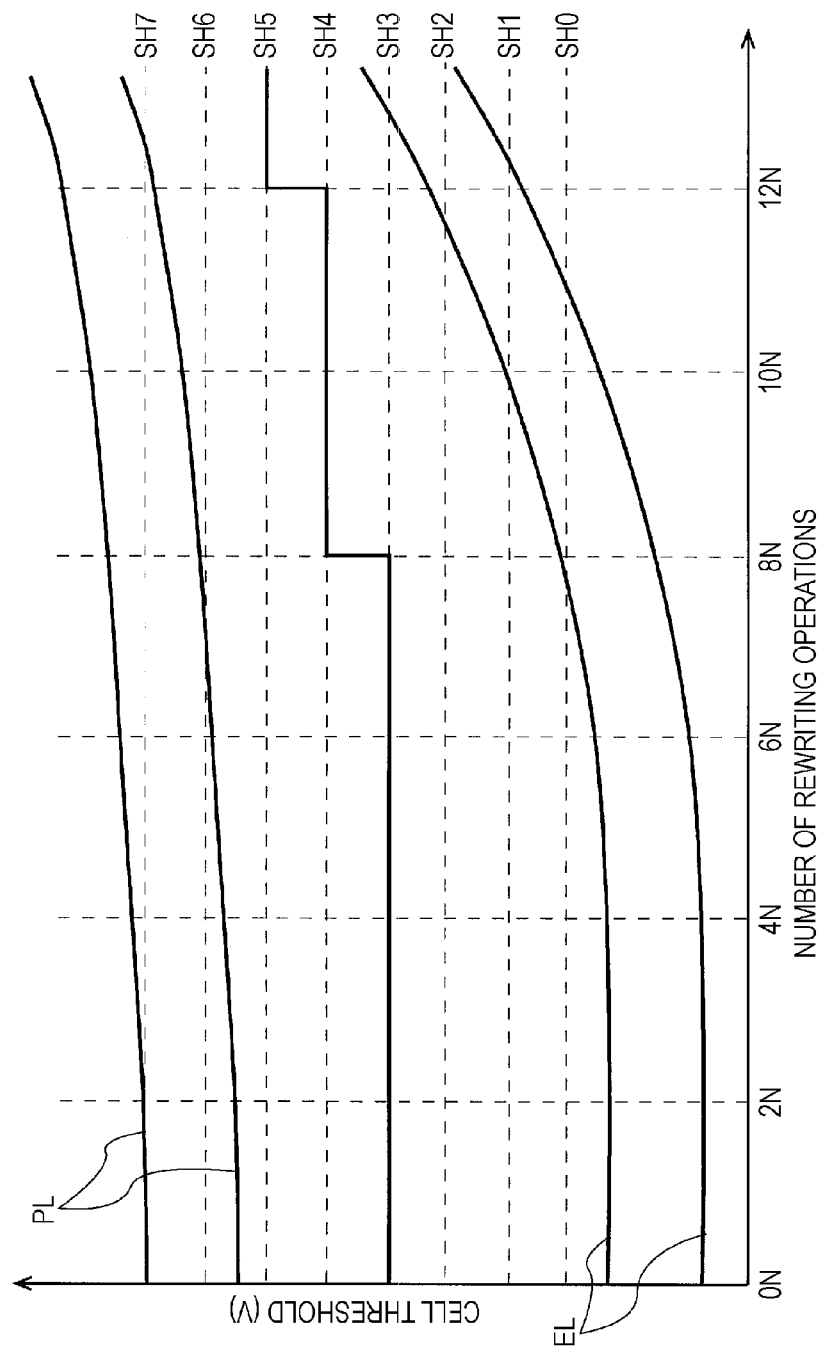
FIG. 8 is a diagram illustrating variation characteristics of a cell with an increase in the number of rewriting operations.

FIG. 8 is a graph illustrating variation characteristics of the cell with an increase in the number of the rewriting operations of the NAND flash array 301. In the graph of FIG. 8, the abscissa indicates the voltage produced on the bit line BL by injecting or extracting charges into or from the cell, and the ordinate indicates the number of the rewriting operations. Solid lines PL indicate variation characteristics of the cell that is in the written state. Solid lines EL indicate variation characteristics of the cell that is in the erased state. Since there are variations between the cells, the two higher and lower solid lines PL indicate a range of the variations, and the two higher and lower solid lines EL indicate a range of the variations. Dashed lines SH0 to SH7 indicate thresholds SH0 to SH7 used for comparisons by the sense amplifiers SA0 to SA7, respectively. That is, a sense amplifier SAn uses a threshold SHn for comparison, where n is a natural number between 0 and 7.

As illustrated in FIG. 8, the voltage level which is produced on the bit line BL by injecting charges into the cell in the written state and the voltage level which is produced on the bit line BL by extracting charges from the cell in the erased state, change proportionally to the number of the rewriting operations of the NAND flash array 301. In addition, the NAND flash array 301 has a characteristic in which a difference between the voltage level held by the cell in the written state and the voltage level held by the cell in the erased state becomes small.

Figure 9:
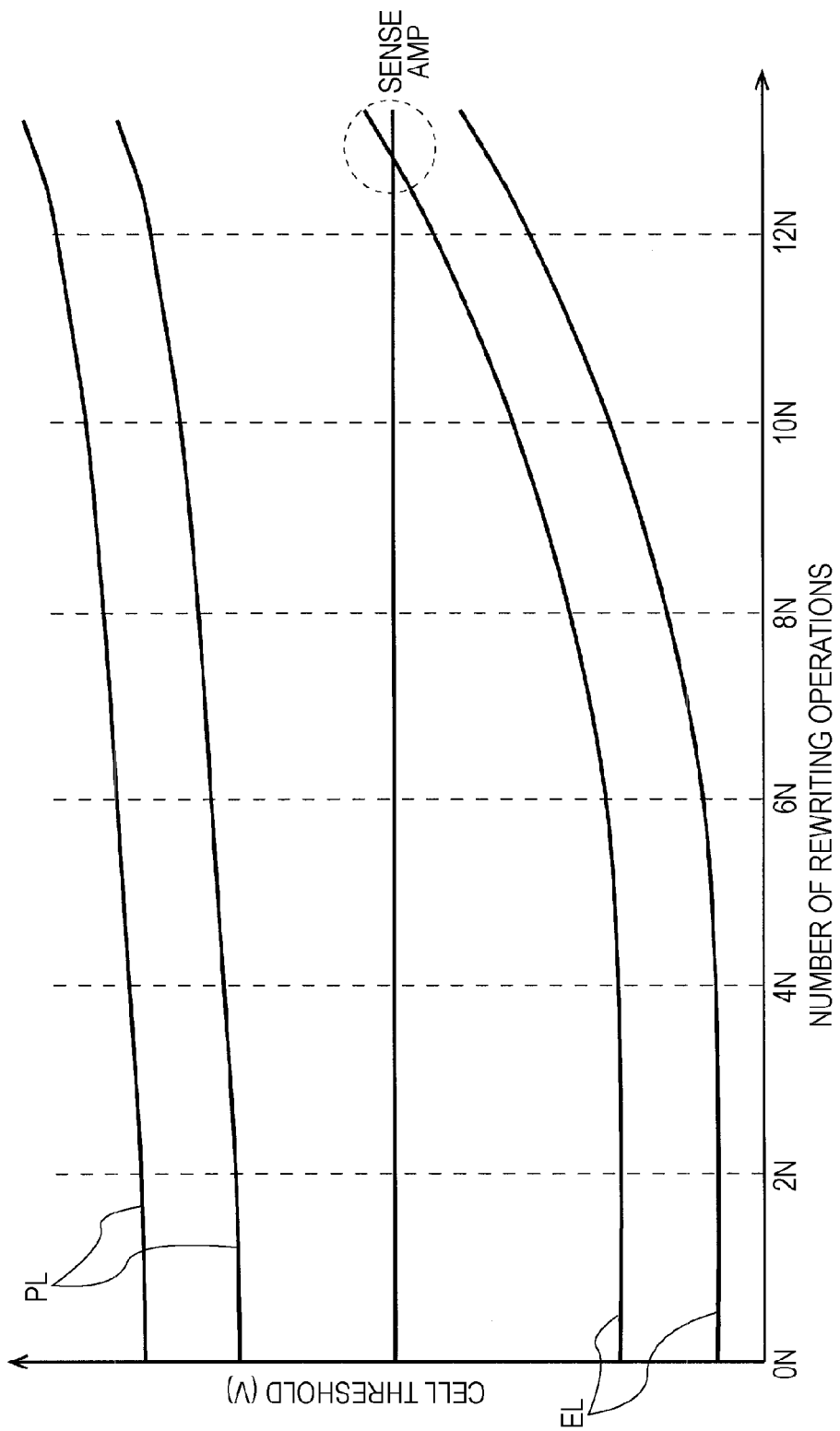
FIG. 9 is a diagram illustrating the variation characteristics of the cell with the increase in the number of the rewriting operations.

For example, when the threshold is fixed to SH3, the voltage which is produced on the bit line BL by extracting charges from the cell in the erased state exceeds the threshold around at the point where the number of rewriting operations exceeds 12N as illustrated in FIG. 9. Thus, data may not be accurately read, causing the end of the lifetime of the flash memory module 10.

Therefore, the flash memory module 10 according to the present embodiment adjusts the threshold at a predetermined timing.

Figure 10:
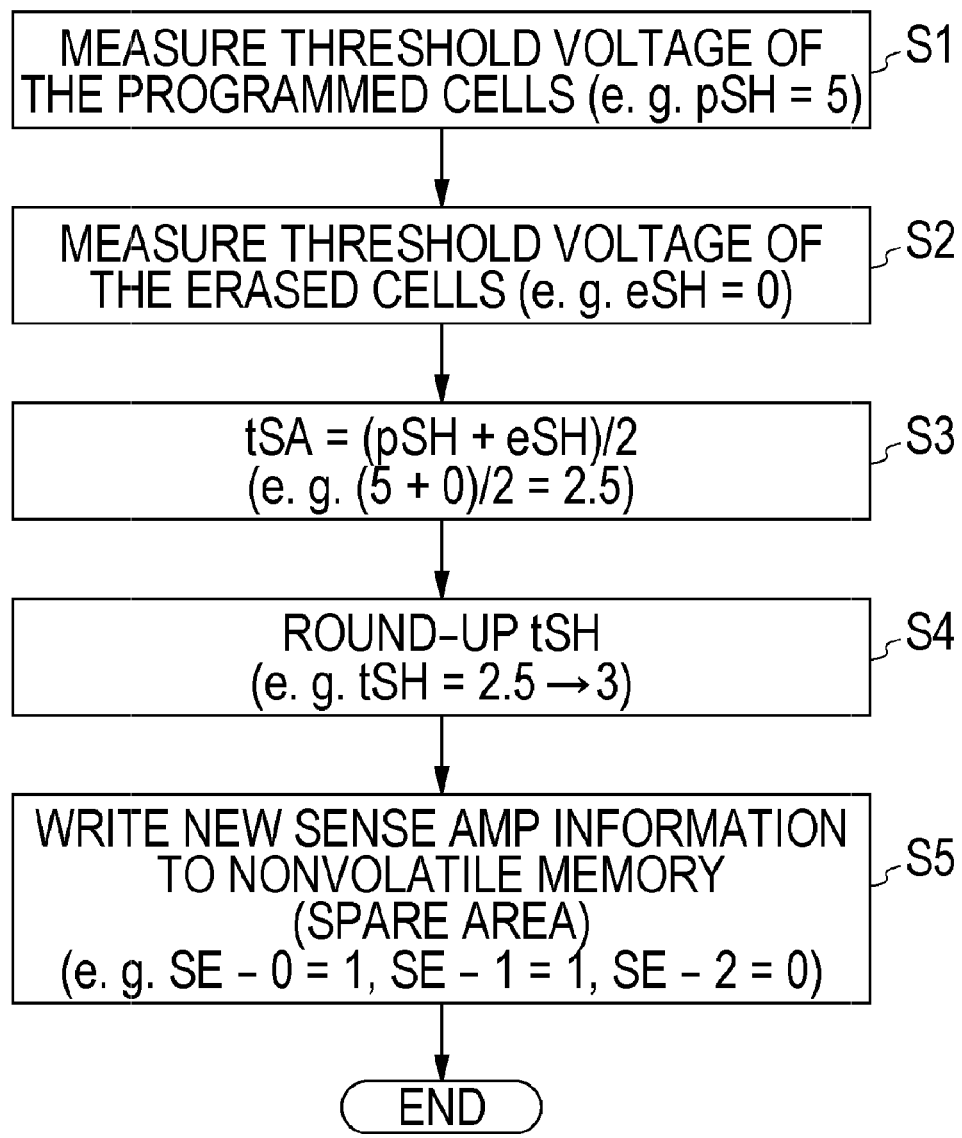
FIG. 10 is a flowchart illustrating the entire flow of a method for adjusting a threshold.

FIG. 10 is a flowchart illustrating the entire flow of the threshold adjustment method. The threshold update unit causes the write unit to write data into the cell. The threshold update unit then causes the read unit to read data from the cell that is in the written state while causing the sense amplifier/comparator circuit 304 to change the threshold so as to calculate a threshold limit pSH that does not cause an error (S1).

In addition, the threshold update unit causes the erasure unit to erase data stored in the cell. The threshold update unit causes the read unit to read the threshold of the cell that is in the written state while causing the sense amplifier/comparator circuit 304 to change the threshold so as to calculate a threshold limit eSH that does not cause an error (S2).

Next, the threshold update unit calculates an intermediate value tSH between the limit pSH of the threshold of the cell in the written state and the limit eSH of the threshold of the cell in the erased state (S3). For example, the intermediate value tSH is calculated according to the following formula 1 using a value n that is related to each threshold SHn.

$$tSH=(pSH+eSH)/2 \quad \text{(Formula 1)}$$

In the present embodiment, since the value n that is related to each threshold SHn is indicated by a natural number, the intermediate value tSH calculated in S3 is rounded up and determined as a new threshold (S4).

The threshold update unit then selects a sense amplifier that uses the threshold determined in S4 for comparison. The threshold update unit writes values indicating the selected sense amplifier in the spare fields SE-0 to SE-2 illustrated in FIG. 7 to update the threshold used for comparison (S5).

In the present embodiment, the values written in the spare fields SE-0 to SE-2 indicate 0, 0, 0 when the sense amplifier SA0 is selected, as illustrated in FIG. 11. The values written in the spare fields SE-0 to SE-2 indicate 0, 0, 1 when the sense amplifier SA1 is selected. The values written in the spare fields SE-0 to SE-2 indicate 0, 1, 0 when the sense amplifier SA2 is selected.

For example, when the number of the rewriting operations of the NAND flash array 301 is 0N (0 times) and the method illustrated in FIG. 10 is applied, the upper limit of the threshold of the cell in the written state is SH5 and the lower limit of the threshold of the cell in the erased state is SH0 according to the variation characteristics illustrated in FIG. 8. Thus, tSA=(5+0)/2=2.5, and the threshold SH3 is determined. The sense amplifier SA3 that uses the threshold SH3 is selected, and values of 0, 1, 1 are written in the spare fields SE-0 to SE-2.

When the number of the rewriting operations of the NAND flash array 301 is 8N and the method illustrated in FIG. 10 is applied, the upper limit of the threshold of the cell in the written state is SH6 and the lower limit of the threshold of the cell in the erased state is SH1 according to the variation characteristics illustrated in FIG. 8. Thus, tSA=(6+1)/2=3.5, and the threshold SH4 is determined. The sense amplifier SA4 that uses the threshold SH4 is selected, and the spare fields SE-0 to SE-2 are updated to 1, 0, 0. In the same way, when the number of the rewriting operations is 120 thousand times, a threshold RC5 is determined. The microprocessor 206 reads the updated identification codes SE-0 to SE-2 of the spare fields and selectively causes the sense amplifiers to operate. Thus, even when the number of the rewriting operations exceeds 12N, the threshold is updated to SH5. Therefore, the voltage held by the cell in the erased state does not exceed the threshold.

The adjustment of the threshold, which is illustrated in FIG. 10, may be performed when the number of rewriting operations reaches a predetermined number. In addition, the adjustment of the threshold may be performed at an arbitrary timing. For example, the adjustment of the threshold may be performed for each rewriting operation, or upon energization (upon activation of the NAND controller 20), or when a read error is detected by an ECC code, or when a format is performed, or the like.

Figure 12:
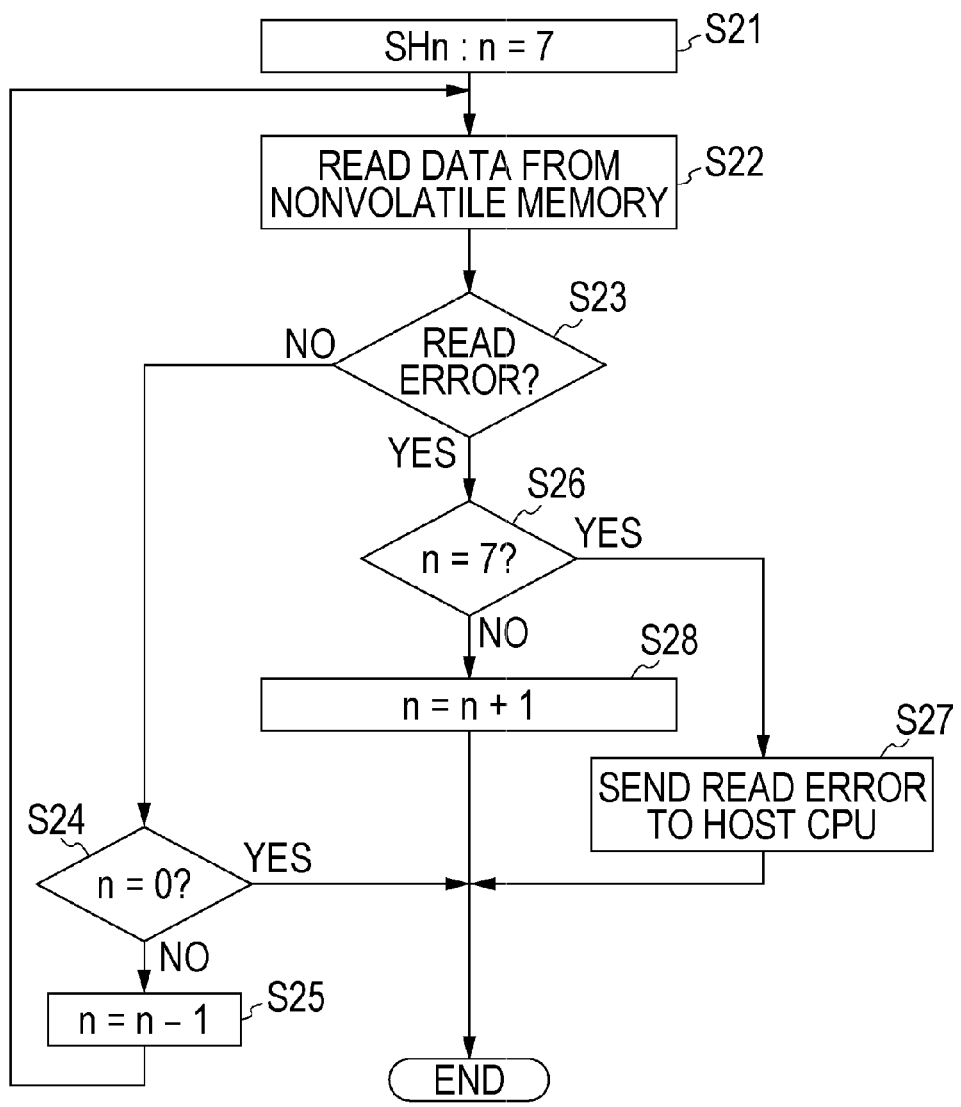
FIG. 12 is an explanatory diagram of a method for measuring an upper limit of the threshold.

FIG. 12 is a detailed explanatory diagram of a method for measuring the upper limit of the threshold in S1 illustrated in FIG. 10.

The threshold update unit first sets the threshold to the maximum value SH7 (S21) and causes the read unit to read out the cell (S22).

The threshold update unit determines whether or not the read result is an error (S23). When the read result is not an error (S23, No) and the threshold has not reached SH0 (S24, No), the threshold update unit reduces the threshold by one step (S25) and the process proceeds back to the reading of S22.

The threshold update unit reduces the threshold and repeats the reading, and the threshold reaches the limit. Then, when the read result is an error (S23, Yes), the threshold update unit determines whether or not the threshold is SH7 (S26). When the threshold is SH7 and the read result is an error, the threshold exceeds the limit due to a failure of the cell or the like. Thus, the threshold update unit notifies the microprocessor 206 of the read error (S27).

On the other hand, when the threshold is not SH7, the threshold update unit determines that the threshold is a threshold that is one step higher (S28). For example, when an error does not occur in the case of the threshold of up to SH1 and a read error occurs in the case of the threshold SH0, the threshold update unit determines that the threshold is SH1 which is one step higher than SH0.

When a read error does not occur even in the case of the threshold SH0, the threshold update unit determines that the threshold is SH0 (S24).

Figure 13:
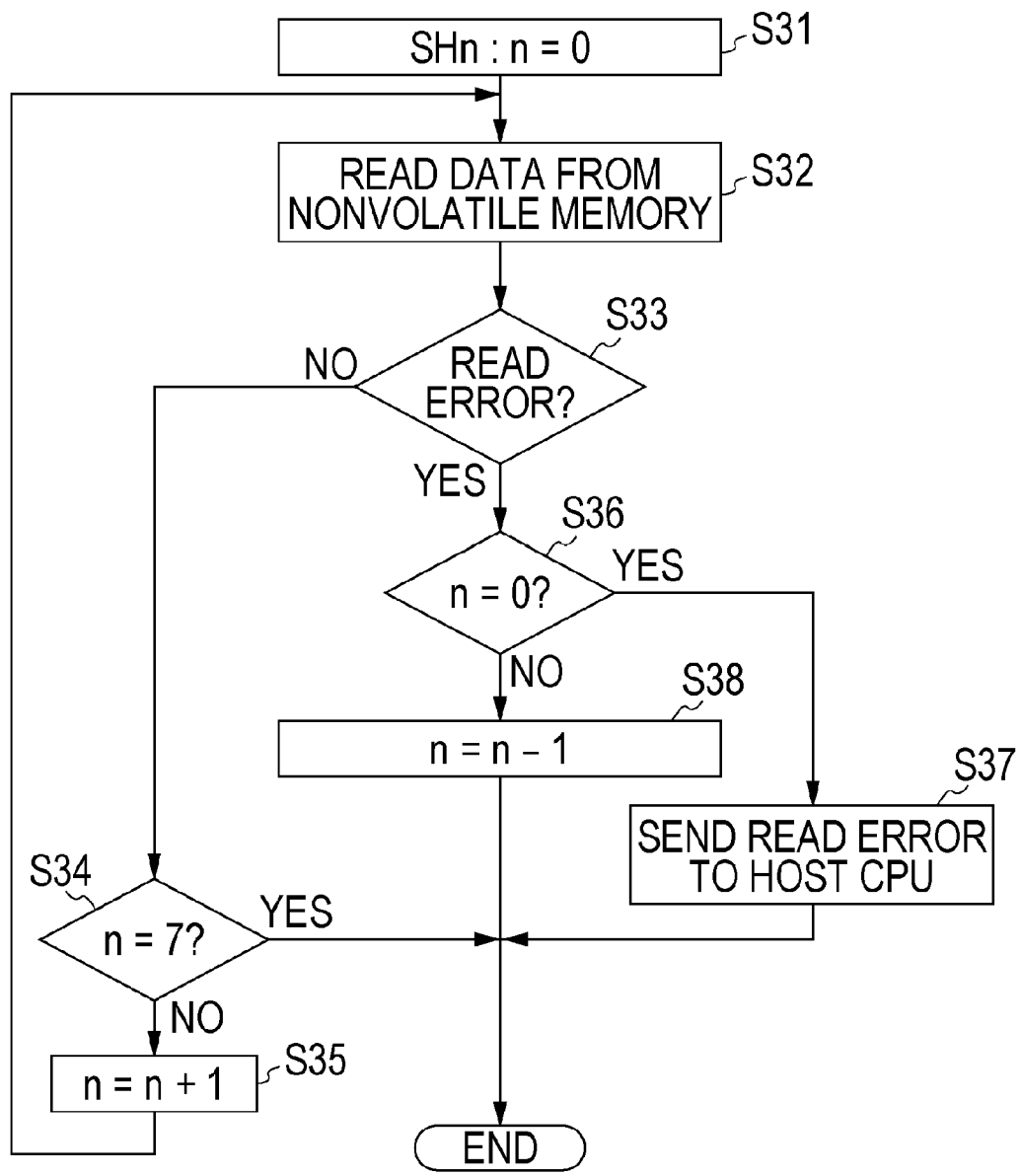
FIG. 13 is an explanatory diagram of a method for measuring a lower limit of the threshold.

FIG. 13 is a detailed explanatory diagram of a method for measuring the lower limit of the threshold in S2 illustrated in FIG. 10.

The threshold update unit first sets the threshold to the minimum value RC0 (S31) and causes the read unit to read out the cell (S32).

The threshold update unit determines whether or not the read result is an error (S33). When the read result is not an error (S33, No) and the threshold has not reached SH7 (S34, No), the threshold update unit increases the threshold by one step (S35) and the process proceeds back to the reading of S32.

The threshold update unit increases the threshold and repeats the reading, and the threshold reaches the limit. Then, when the read result is an error (S33, Yes), the threshold update unit determines whether or not the threshold is SH0 (S36). When the threshold is SH0 and the read result is an error, the threshold exceeds the limit due to a failure of the cell or the like. Thus, the threshold update unit notifies the microprocessor 206 of the read error (S37).

On the other hand, when the threshold is not SH0 in S36, the threshold update unit determines that the threshold is a threshold that is one step lower (S38). For example, when an error does not occur in the case of the threshold of up to SH6 and a read error occurs in the case of the threshold SH7, the threshold update unit determines that the threshold is SH6 which is one step lower than SH7.

When a read error does not occur even in the case of the threshold SH7, the threshold update unit determines that the threshold is SH7 (S34).

As described above, according to the present embodiment, the threshold is adjusted to an intermediate value between the upper limit pSH and the lower limit eSH in accordance with the variation characteristics of the cell. Accordingly, the lifetime of the flash memory 10 may be increased, and the margins for comparison of the cell voltages with the threshold may be increased. Thus, the reliability may be improved.

In the variation characteristics of the cell, the voltage held by the cell becomes higher as the number of the rewriting operations increases. The lifetime of the flash memory 10 is further increased by rounding up the threshold to a value that is higher than the intermediate value in S4 of FIG. 10. Furthermore, in the present embodiment, the intermediate value calculated in S3 of FIG. 10 is a half of the sum of the upper and lower limits. The present embodiment is not limited to this. The intermediate value may be set to any rate such as 1/1.5 or 2/3 of the sum of the upper and lower limits.

The first embodiment describes the case in which one cell stores data of 1 bit. The second embodiment is an example in which one cell stores data of multiple values.

Figure 14:
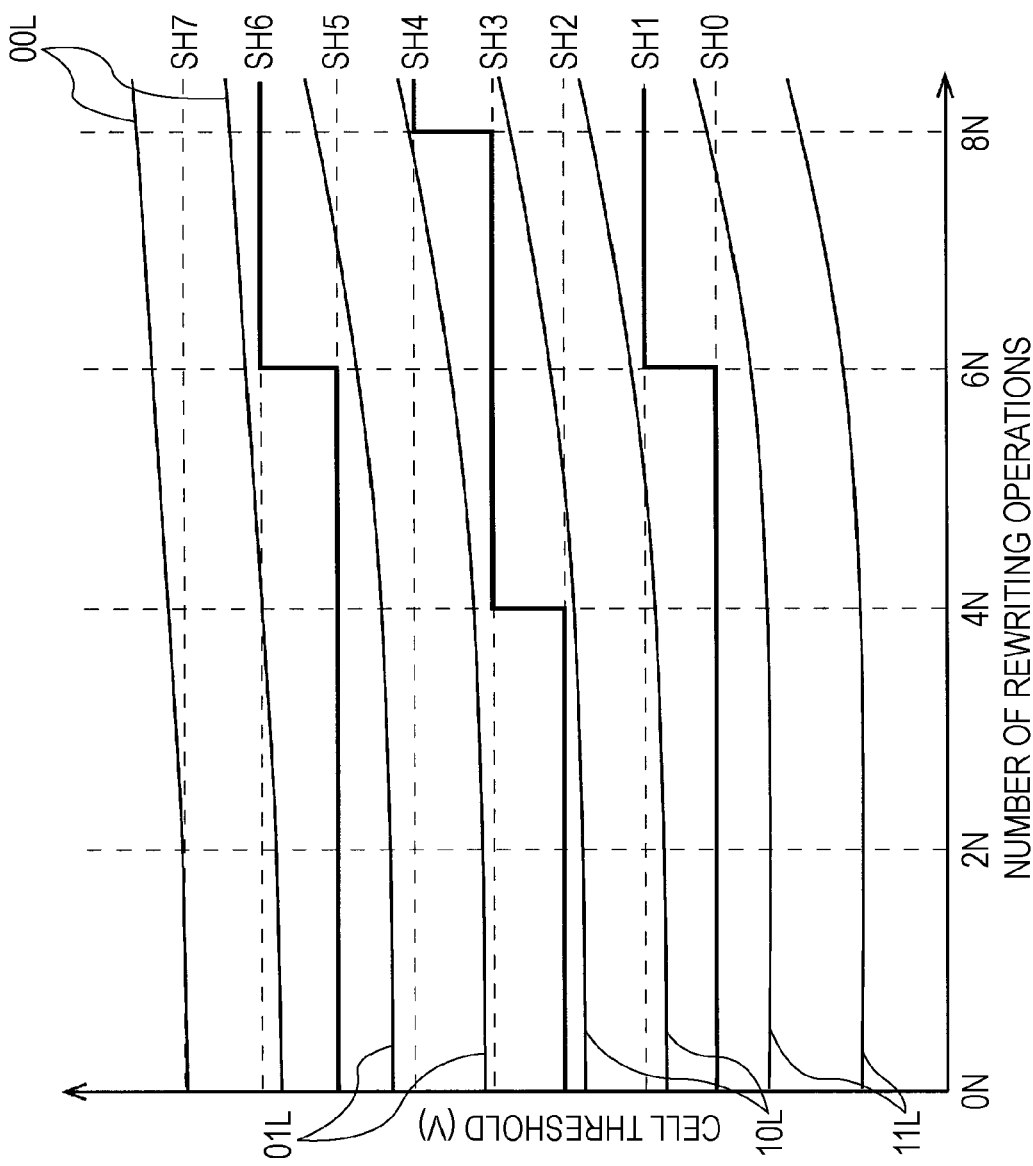
FIG. 14 is a diagram illustrating variation characteristics of a cell according to the second embodiment.
Figure 15:
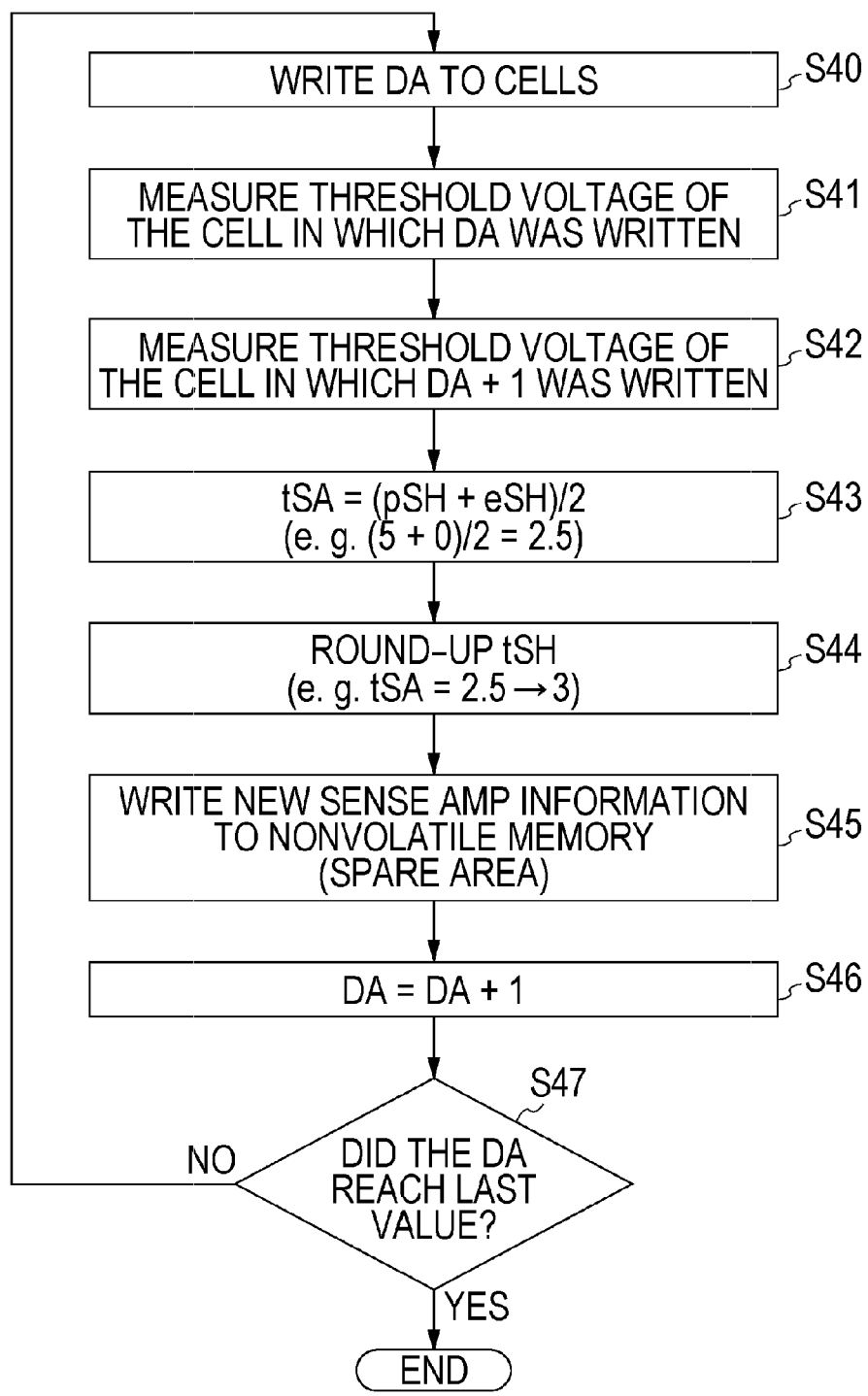
FIG. 15 is an explanatory diagram of a method for adjusting a threshold.
Figure 16:
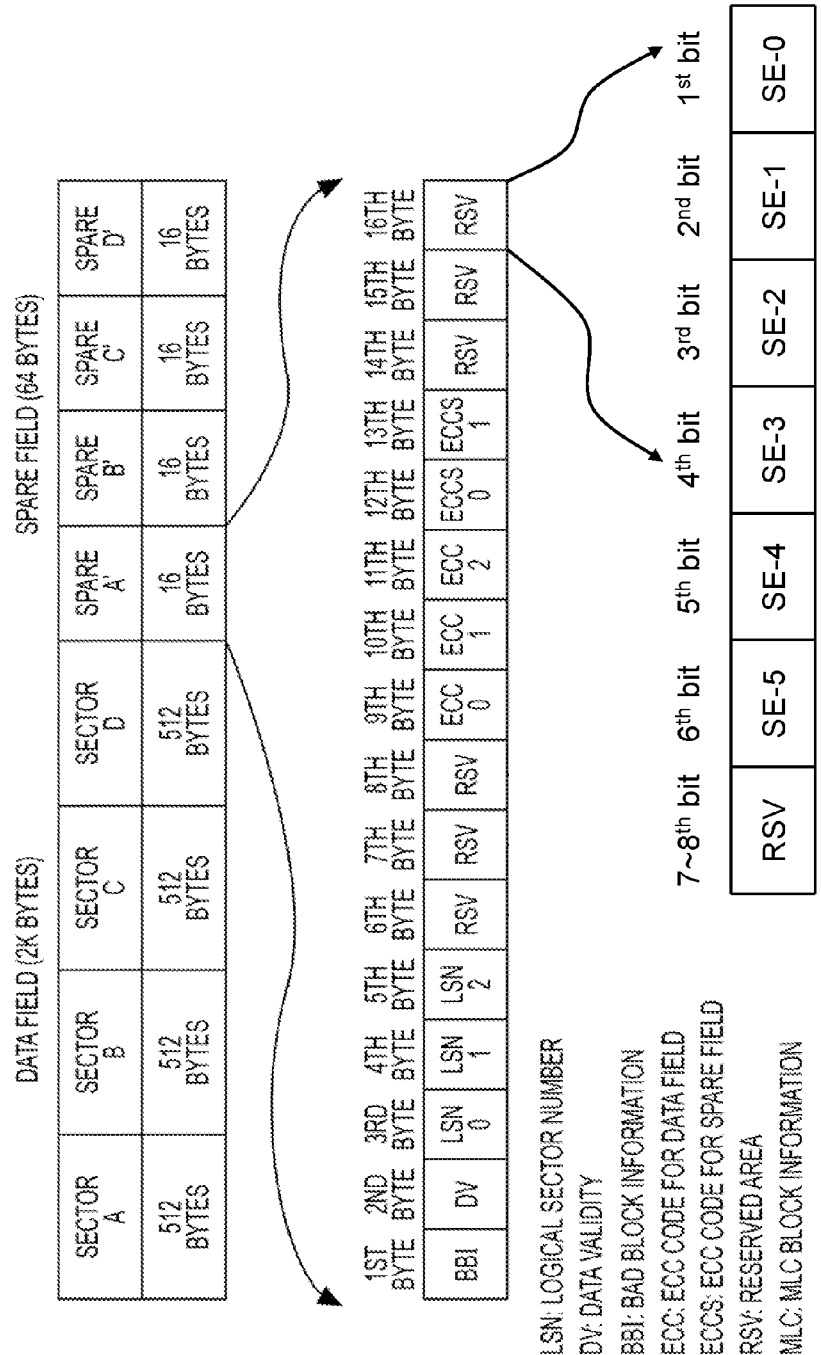
FIG. 16 is an explanatory diagram of a region for storing user data and management data.

FIG. 14 is a diagram illustrating variation characteristics of the cell according to the second embodiment. FIG. 15 is an explanatory diagram of a method for adjusting a threshold. FIG. 16 is an explanatory diagram of a region for storing user data and management data. Other configurations are the same as those of the first embodiment and are not described again.

In the present embodiment, one cell stores data of 2 bits. That is, the states of charges of the floating gate are written at four levels which are 00, 01, 10 and 11. Thus, a cell current of one cell is compared with three thresholds and determined to be any of the levels, and data is read out.

In the graph of FIG. 14, the ordinate indicates a voltage which is produced on the bit line BL by injecting or extracting charges into or from the floating gate of the cell, and the abscissa indicates the number of rewriting operations. Solid lines 00L indicate variation characteristics of the cell in which data of 00 is written. Solid lines 01L indicate variation characteristics of the cell in which data of 01 is written. Solid lines 10L indicate variation characteristics of the cell in which data of 10 is written.

Solid lines 11L indicate variation characteristics of the cell in which data of 11 is stored, i.e., variation characteristics of the cell that is in the erased state. Since there are variations between the cells, the two higher and lower solid lines 00L to 11L indicate ranges of the variations. Dashed lines SH0 to SH7 indicate thresholds SH0 to SH7 used for comparisons by the sense amplifiers SA0 to SA7, respectively. That is, a sense amplifier SAn uses a threshold SHn for comparison.

As illustrated in FIG. 15, a threshold adjustment unit according to the second embodiment causes the write unit to write, in the cell, a specified value DA among the values 00, 01, 10 that are to be written in the cell, i.e., among values other than the erased state (S40). In the present embodiment, the maximum value 00 is first written.

Next, the threshold adjustment unit sequentially selects the sense amplifiers SA0 to SA7. The threshold adjustment unit uses the read unit for reading data of the cell in which the DA is written while changing the threshold. The threshold adjustment unit then calculates an upper threshold limit pSH that does not cause an error (S41).

In addition, the threshold update unit writes, in the cell, a value that is one step lower in voltage level than the value written in S40, i.e., DA+1. The threshold update unit causes the read unit to read the threshold of the cell in the erased state while causing the sense amplifier/comparator circuit 304 to change the threshold. The threshold update unit then calculates a lower threshold limit eSH that does not cause an error (S42). For example, when the value written in S40 is 00, a value of 01 is written.

Next, the threshold update unit calculates an intermediate value tSH between the upper threshold limit pSH and the lower threshold limit eSH (S43). For example, the intermediate value tSH is calculated according to the following formula 1 using a value n that is related to each threshold SHn.

$$tSH=(pSH+eSH)/2 \qquad \text{(Formula 1)}$$

In the second embodiment, since the value n that is related to each threshold SHn is indicated by a natural number, the intermediate value tSH calculated in S43 is rounded up and determined as a new threshold (S44). For example, when pSH is 6 and eSH is 6, tSH=6 and the threshold is determined to be SH6.

The threshold update unit then selects a sense amplifier that uses the threshold determined in S43 for comparison. The threshold update unit writes values indicating the selected sense amplifier in spare fields illustrated in FIG. 16 to update the threshold used for comparison (S45). For example, when SH5 is determined as a threshold that determines whether the values are 00 or 01, values of 10, which correspond to the sense amplifier SA5 using SH5, are written in SE-1 and SE-2, as illustrated in FIG. 17.

In FIG. 17, SE-0 and SE-1 are values indicating a sense amplifier that determines whether values written in the cell are 00 or 01. SE-2 and SE-3 are values indicating a sense amplifier that determines whether values written in the cell are 01 or 10. SE-4 and SE-5 are values indicating a sense amplifier that determines whether values written in the cell are 10 or 11. For example, when SA6, SA3, SA0 are operated, SE-0 to SE-5 are 1, 0, 1, 0, 0, 0.

Then, a value next to the value DA written in S40 is selected (S46). S40 to S46 are repeated until the value DA becomes the last value (S47). That is, values of 00 are written in S40. After that, values of 01 are written when the process proceeds back to S40. Then, values of 01 are written in S40. Values of 10 are then written when the process proceeds back to S40. When the values of 10 are written in S40, the data of the cell is erased by the erasure unit in S42, i.e., the cell is in a state in which values of 11, which are higher by one than the values of 10, are stored.

In S46, the DA is counted up. When the DA is 11, the process is terminated.

As described above, according to the second embodiment, the threshold may be adjusted even when one cell stores data of multiple values, and the lifetime of the flash memory module 10 may be improved.

The circuit configuration such as the sense amplifier/comparator circuit 304 according to the first embodiment is the same as that according to the second embodiment. Thus, writing of data of 1 bit in one cell and writing of data of multiple values in one cell may be switched by switching control operations such as data writing and data reading by means of the firmware.

For example, a flag indicating MLC or a flag indicating SLC is stored in the ROM 207 of the NAND controller 20, and the microprocessor 206 references the flag. When the flag indicates SLC, the control of the first embodiment is performed. When the flag indicates MLC, the control of the second embodiment is performed.

The MLC and the SLC may be switched for each sector. For example, the values of SE-0 and SE-1 do not become 1 in the second embodiment. When SLC is used, values of 1 are written in the 6th byte and the 7th byte. The microprocessor 206 references the 6th byte and the 7th byte of the spare field. When the values in the 6th byte and the 7th byte are 1, the control of the first embodiment is performed. When the values in the 6th byte and the 7th byte are values other than the values of 1, the control of the second embodiment is performed.

Accordingly, the same flash memory module 10 may be switched to the SLC providing high reliability and to the MLC capable of increasing a capacity and used.

The present invention is not limited to the aforementioned illustrated examples and may be subject to various modifications without departing from the gist of the present invention.

For example, the threshold adjustment methods illustrated in FIGS. 10 and 15 are performed by the microprocessor 206 provided in the flash memory module 10. The present invention is not limited to this. The threshold adjustment methods illustrated in FIGS. 10 and 15 may be performed by the CPU of the information processing device 1.

In addition, the present invention may be the following appended configurations. These elements may be combined to the maximum extent possible.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiments of the present invention have been described in detail, it should be understood that the various changes, substitutions, and alterations could be made hereto without departing from the spirit and scope of the invention.

What is claimed is:

1. A nonvolatile semiconductor storage device, comprising:
   a cell for memorizing data by storing an electric charge;
   a write unit for writing or erasing data on the cell by injecting or extracting the electric charge into or from the cell;
   a plurality of reference cells for holding reference voltage, each of the plurality of reference cells holds different reference voltage;
   a plurality of comparators for comparing a cell current of the cell with a reference current of the plurality of reference cells;
   and
   a threshold update unit for selecting one of the plurality of comparators and one of the plurality of reference cells, and for determining the holding voltage of the selected reference cell as a threshold distinguishing written state or erased state of the cell.

2. The nonvolatile semiconductor storage device according to claim 1, wherein
   the cell write the two values, the two values being a written state and an erased state of the cell, and
   the threshold update unit
      calculates an upper limit of the threshold on a state of writing the data on the cell without any read errors,
      calculates a lower limit of the threshold on a state of writing the data on the cell without any read errors, and
      determines the threshold between the upper limit and the lower limit.

3. The nonvolatile semiconductor storage device according to claim 1, wherein
   the cell write the two values, the two values being a written state and an erased state of the cell, and
   the threshold update unit
      calculates an upper limit of the threshold on a state of writing the data on the cell without any read errors,
      calculates a lower limit of the threshold on a state of writing the data on the cell without any read errors, and
      determines a most closest threshold being over an intermediate value between the upper limit and the lower limit.

4. The nonvolatile semiconductor storage device according to claim 1, wherein
   the cell stores multiple values, and
   the threshold update unit
      calculates an upper limit of the threshold on a state of writing a specified value on the cell without any read errors,
      calculates a lower limit of the threshold on a state of writing the specified value on the cell without any read errors, and
      determines the threshold corresponding to the specified value between the upper limit and the lower limit.

5. A controller, comprising:
   a write unit for writing or erasing data on a cell by injecting or extracting an electric charge into or from the cell, the cell memorizing data by storing the electric charge;
   a plurality of reference cells for holding reference voltage, each of the plurality of reference cells holds a different reference voltage;
   a plurality of comparators for comparing a cell current of the cell with a reference current of the plurality of reference cells;
   a threshold unit update selecting one of the plurality of comparators and one of the plurality of reference cells, and for determining the holding voltage of the selected reference cell as a threshold distinguishing written state or erased state of the cell.

6. The controller according to claim 5, wherein
   the cell write the two values, the two values being a written state and an erased state of the cell, and
   the threshold update unit
      calculates an upper limit of the threshold on a state of writing the data on the cell without any read errors,
      calculates a lower limit of the threshold on a state of writing the data on the cell without any read errors, and
      determines the threshold between the upper limit and the lower limit.

7. The controller according to claim 5, wherein
   the cell write the two values, the two values being a written state and an erased state of the cell, and
   the threshold update unit
      calculates an upper limit of the threshold on a state of writing the data on the cell without any read errors,
      calculates a lower limit of the threshold on a state of writing the data on the cell without any read errors, and
      determines a most closest threshold being over an intermediate value between the upper limit and the lower limit.

8. The controller according to claim 5, wherein
   the cell store multiple values, and
   the threshold update unit
      calculates an upper limit of the threshold on a state of writing a specified value on the cell without any read errors,
      calculates a lower limit of the threshold on a state of writing the specified value on the cell without any read errors, and
      determines the threshold corresponding to the specified value between the upper limit and the lower limit.

9. A threshold adjustment method performed by using a controller, comprising:
- writing or erasing data on a cell by injecting or extracting an electric charge into or from the cell, the cell memorizing data by storing the electric charge;
- comparing a cell current of the cell with a reference current of a plurality of reference cells;
- selecting one of the plurality of reference cells, and determining a holding voltage of the selected reference cell as a threshold distinguishing written state or erased state of the cell.

10. The method according to claim 9, further comprising:
- writing the two values on the cell, the two values being a written state and an erased state of the cell;
- calculating an upper limit of the threshold on a state of writing the data on the cell without any read errors;
- calculating a lower limit of the threshold on a state of writing the data on the cell without any read errors; and
- determining the threshold between the upper limit and the lower limit.

11. The method according to claim 9, further comprising:
- writing the two values on the cell, the two values being a written state and an erased state of the cell;
- calculating an upper limit of the threshold on a state of writing the data on the cell without any read errors;
- calculating a lower limit of the threshold on a state of writing the data on the cell without any read errors; and
- determining the threshold between the upper limit and the lower limit.

12. The method according to claim 9, further comprising:
- storing multiple values on the cell;
- calculating an upper limit of the threshold on a state of writing a specified value on the cell without any read errors;
- calculating a lower limit of the threshold on a state of writing the specified value on the cell without any read errors; and
- determining the threshold corresponding to the specified value between the upper limit and the lower limit.

* * * * *